United States Patent
Cho

(10) Patent No.: US 9,224,800 B2
(45) Date of Patent: Dec. 29, 2015

(54) PLANAR INTERDIGITATED CAPACITOR STRUCTURES AND METHODS OF FORMING THE SAME

(71) Applicant: Taiwan Semiconductor Manufacturing Co., Ltd., Hsin-Chu (TW)

(72) Inventor: Hsiu-Ying Cho, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/049,268

(22) Filed: Oct. 9, 2013

(65) Prior Publication Data

US 2014/0035100 A1   Feb. 6, 2014

Related U.S. Application Data

(62) Division of application No. 13/523,917, filed on Jun. 15, 2012, now abandoned.

(51) Int. Cl.
*H01L 49/02* (2006.01)
*H01L 23/522* (2006.01)

(52) U.S. Cl.
CPC ............ *H01L 28/82* (2013.01); *H01L 23/5223* (2013.01); *H01L 28/86* (2013.01)

(58) Field of Classification Search
CPC .................................. H01G 4/30; H01G 4/232
USPC .................... 361/306.3; 257/307; 438/396
IPC .................................................. H01L 23/5223
See application file for complete search history.

(56) References Cited

U.S. PATENT DOCUMENTS

| 5,583,359 | A  | * | 12/1996 | Ng et al. ................... 257/306 |
| 6,383,858 | B1 |   | 5/2002  | Gupta et al. |
| 6,532,143 | B2 | * | 3/2003  | Figueroa et al. ........... 361/301.4 |
| 6,743,671 | B2 |   | 6/2004  | Hu et al. |
| 6,822,312 | B2 | * | 11/2004 | Sowlati et al. ............. 257/532 |
| 7,268,383 | B2 | * | 9/2007  | Felsner et al. ............. 257/306 |
| 7,298,001 | B1 | * | 11/2007 | Liu et al. .................... 257/306 |
| 7,329,955 | B2 |   | 2/2008  | Tsau |
| 7,994,610 | B1 | * | 8/2011  | Quinn ........................ 257/532 |
| 8,278,217 | B2 | * | 10/2012 | Imanaka et al. ............ 438/683 |
| 2002/0113292 | A1 | * | 8/2002  | Appel ........................ 257/532 |
| 2002/0141138 | A1 | * | 10/2002 | Honda et al. ............... 361/311 |
| 2004/0140553 | A1 | * | 7/2004  | Naito et al. ................. 257/700 |

(Continued)

*Primary Examiner* — Eugene Lee
(74) *Attorney, Agent, or Firm* — Duane Morris LLP

(57) ABSTRACT

A planar interdigitated capacitor structure, methods of forming, and devices including, the same. The device includes first and second planar electrode structures including respective first and second pluralities of planar continuous rectangular plate electrode elements formed above a semiconductor substrate and extending continuously in first and second orthogonal directions substantially parallel to a plane of the substrate, and first and second conductors interconnecting the respective first and second pluralities of planar electrode elements parallel to a third axis substantially normal to the plane of the substrate. The first and second planar electrode structures are arranged with respective continuous rectangular plate electrode elements of each planar electrode structure interleaved and substantially parallel with each other between the first and second conductors. The device also includes a dielectric material between the first planar electrode structure and the second planar electrode structure.

22 Claims, 11 Drawing Sheets

(56) References Cited

U.S. PATENT DOCUMENTS

| | | | |
|---|---|---|---|
| 2004/0222494 A1* | 11/2004 | Laws | 257/532 |
| 2006/0152886 A1 | 7/2006 | Togashi et al. | |
| 2007/0133147 A1* | 6/2007 | Ritter et al. | 361/306.3 |
| 2007/0159272 A1* | 7/2007 | Niki | 333/185 |
| 2007/0187739 A1* | 8/2007 | Liu et al. | 257/306 |
| 2009/0002921 A1* | 1/2009 | Ritter et al. | 361/321.3 |
| 2009/0014832 A1* | 1/2009 | Baumgartner et al. | 257/532 |
| 2009/0128985 A1* | 5/2009 | Aoki | 361/301.4 |
| 2009/0268373 A1* | 10/2009 | Sato et al. | 361/306.3 |
| 2010/0002356 A1* | 1/2010 | Yoshida et al. | 361/301.4 |
| 2010/0027189 A1 | 2/2010 | Togashi et al. | |
| 2010/0039749 A1* | 2/2010 | Ritter et al. | 361/301.4 |
| 2010/0188799 A1* | 7/2010 | Galvagni et al. | 361/306.3 |
| 2011/0059593 A1* | 3/2011 | Xue et al. | 438/396 |
| 2011/0122540 A1* | 5/2011 | Ogawa et al. | 361/305 |
| 2012/0081832 A1* | 4/2012 | Chikara | 361/301.4 |
| 2013/0056853 A1* | 3/2013 | Cho | 257/534 |
| 2013/0074018 A1 | 3/2013 | Hsu et al. | |
| 2013/0093045 A1* | 4/2013 | Cho | 257/531 |
| 2013/0111083 A1 | 5/2013 | Wu et al. | |

* cited by examiner

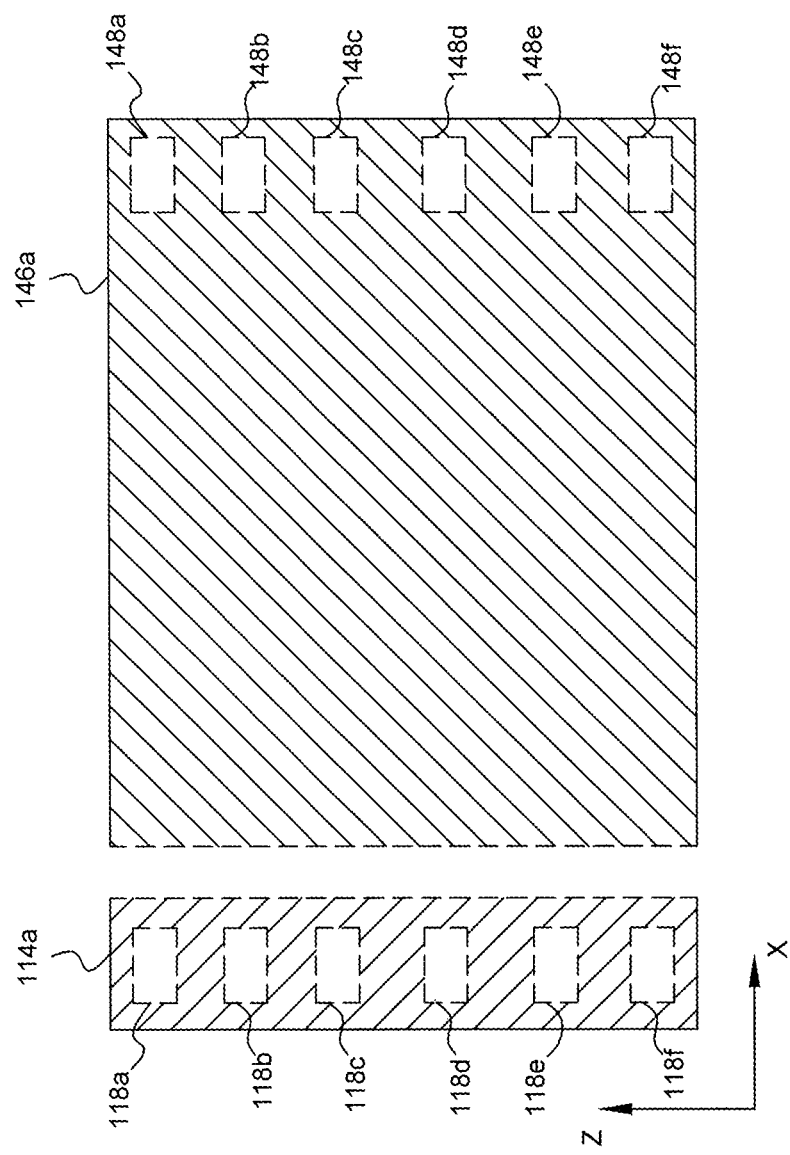

(M1 Layer)

(M2 Layer)

(M3 Layer)

(M4 Layer)

(M5 Layer)

(M6 Layer)

(V1 Layer)

(V2 Layer)

(V3 Layer)

(V4 Layer)

(V5 Layer)

(M1 Layer)

(M2 Layer)

(M3 Layer)

(M4 Layer)

(M5 Layer)

(M6 Layer)

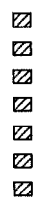
FIG. 3G
(V1 Layer)
FIG. 3H
(V2 Layer)
FIG. 3I
(V3 Layer)
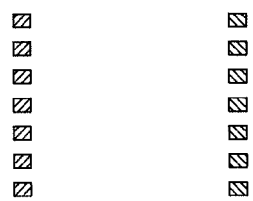
FIG. 3J
(V4 Layer)
FIG. 3K
(V5 Layer)

PLANAR INTERDIGITATED CAPACITOR STRUCTURES AND METHODS OF FORMING THE SAME

CROSS-REFERENCE TO RELATED APPLICATIONS

This application is a divisional application of and claims priority to U.S. patent application Ser. No. 13/523,917, filed on Jun. 15, 2012, the entirety of which is herein incorporated by reference.

FIELD

The present disclosure relates generally to semiconductor fabrication, and more specifically to methods for formation of interdigitated capacitors.

BACKGROUND

Capacitors are essential components to many integrated circuits (ICs), such as sample-and-hold circuits, analog-to-digital (A/D) circuits, digital-to-analog (D/A) circuits and resonant circuits, switched-capacitor and continuous-time filters, as well as to many radio frequency (RF) applications. Capacitors are extensively used for many logic and other applications in the semiconductor manufacturing industry and are integrated into various different types of semiconductor devices. Due to higher integration requirements to minimize costs associated with IC fabrication processes, the semiconductor manufacturing industry strives toward economization of each process step and minimization of chip size, while maximizing quality and functionality to the extent possible. Due to these trends of miniaturization or scaling of ICs to provide smaller ICs and improved performance, capacitor designs that are low area consuming and have high capacitance density are highly desirable. However, conventional metal-on-metal (MOM) capacitor structures consume large areas and have low capacitance density.

BRIEF DESCRIPTION OF THE DRAWINGS

Various aspects of the present disclosure will be or become apparent to one of ordinary skill in the art by reference to the following detailed description when considered in connection with the accompanying exemplary non-limiting embodiments.

FIG. 1F is a plan view of several layers of an example of an interdigitated capacitor, from which the M6 layer is omitted for ease of viewing several of the underlying layers according to embodiments of the present disclosure.

FIGS. 3G-3K illustrates plan views of via layers for an example of an interdigitated capacitor according to embodiments of the present disclosure.

DETAILED DESCRIPTION OF THE EXAMPLES

Figure 1A:
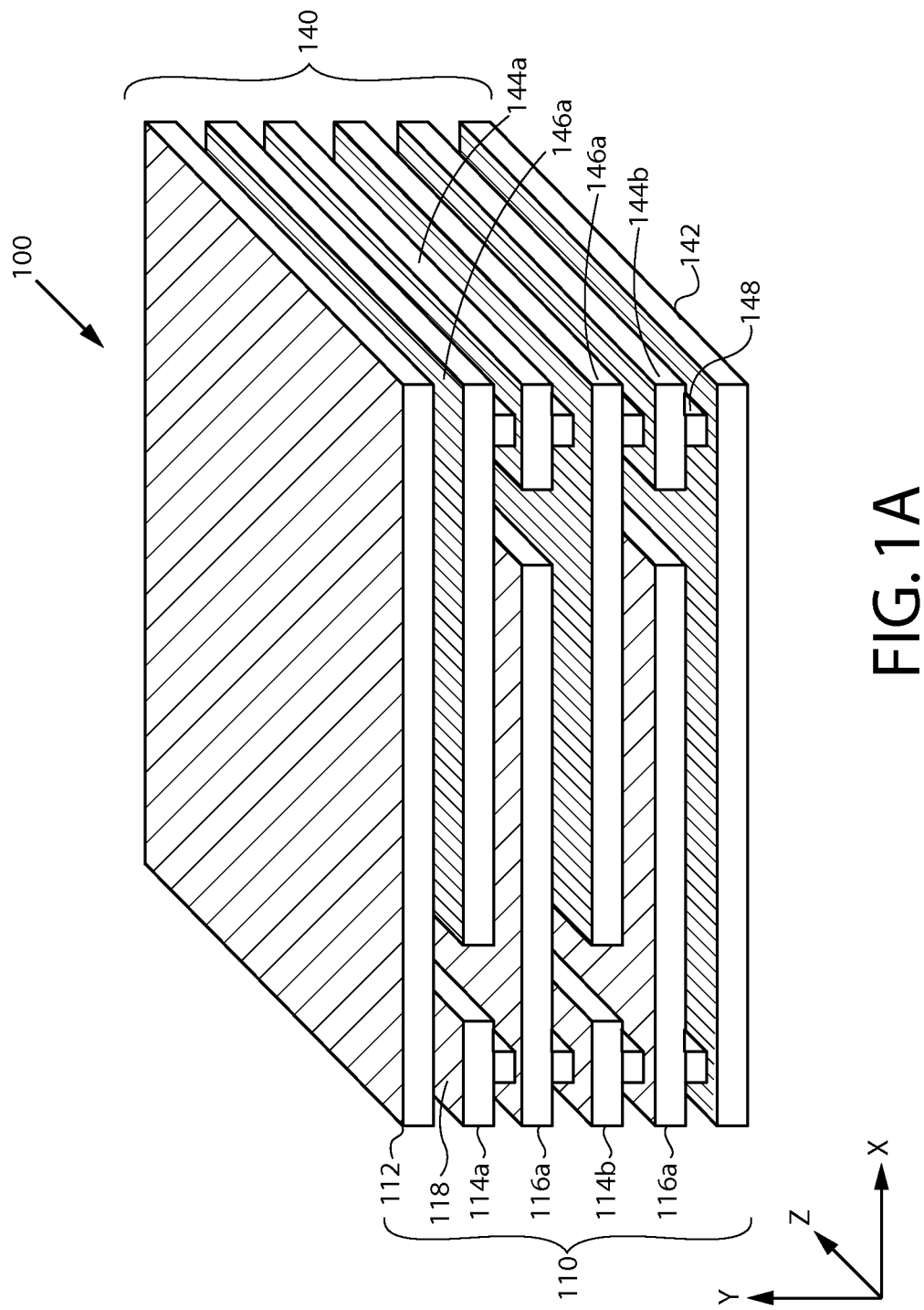
FIG. 1A is a schematic view of an example of an interdigitated capacitor according to embodiments of the present disclosure.

With reference to the Figures, where like elements have been given like numerical designations to facilitate an understanding of the drawings, the various embodiments of a multi-gate semiconductor device and methods of forming the same are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and can even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

Improved capacitor structures, methods of forming the same, and devices including the same, are provided. The inventor has discovered new capacitor structures formed using planar electrode structures having a plurality of planar continuous plate electrode elements. These new capacitor structures increase capacitance density and quality factor (Q) and thus improve performance and reduce cost. The inventor has observed that increased coupling area provided by the planar continuous plate electrode elements, resulting in higher capacitance densities and quality factors than observed in conventional capacitor structures, can be achieved by forming the novel planar capacitor structures by alternating respective, substantially parallel, planar continuous plate electrode elements of planar electrode structures of opposite polarities between a respective edge parallel to a vertical axis. The novel capacitor structures improve capacitance values by permitting horizontal and vertical coupling between electrode elements of electrode structures of opposite polarities and by increasing the coupling area of the electrode elements using the planar continuous plate design. The higher capacitance density achievable in the planar interdigitated capacitor structures also results in less consumption of fractional die area than conventional capacitors, thus improving yield and reducing costs. The quality factor of capacitors is inversely proportional to the resistance of the capacitors. The inventor has determined that the planar interdigitated capacitor structures achieve high quality factors as the planar continuous plate electrode elements have lower resistance values than conventional discrete "finger" electrodes.

FIG. 1A is a schematic view of an example of a planar interdigitated capacitor structure 100 according to embodiments of the present disclosure. The planar interdigitated capacitor structure 100 includes a first planar electrode structure 110 and a second planar electrode structure 140. As shown, a plane of the capacitor structure can be defined in the orthogonal x direction and z direction. The first planar electrode structure 110 includes a first plurality of planar continuous rectangular plate electrode elements 112, 114a, 114b, 116a, 116b. The second planar electrode structure 140 includes a first plurality of planar continuous electrode elements 142, 144a, 144b, 146a, 146b. The planar continuous electrode elements 112, 114a, 114b, 116a, 116b (142, 144a, 144b, 146a, 146b) comprise a conductive material. For example, in various embodiments, the planar continuous electrode elements 112, 114a, 114b, 116a, 116b (142, 144a, 144b, 146a, 146b) comprise a copper material. In some embodiments, the planar continuous electrode elements 112, 114a, 114b, 116a, 116b (142, 144a, 144b, 146a, 146b) comprise a doped polysilicon, aluminum, titanium nitride, tantalum nitride, or aluminum nitride material.

Figure 1B:
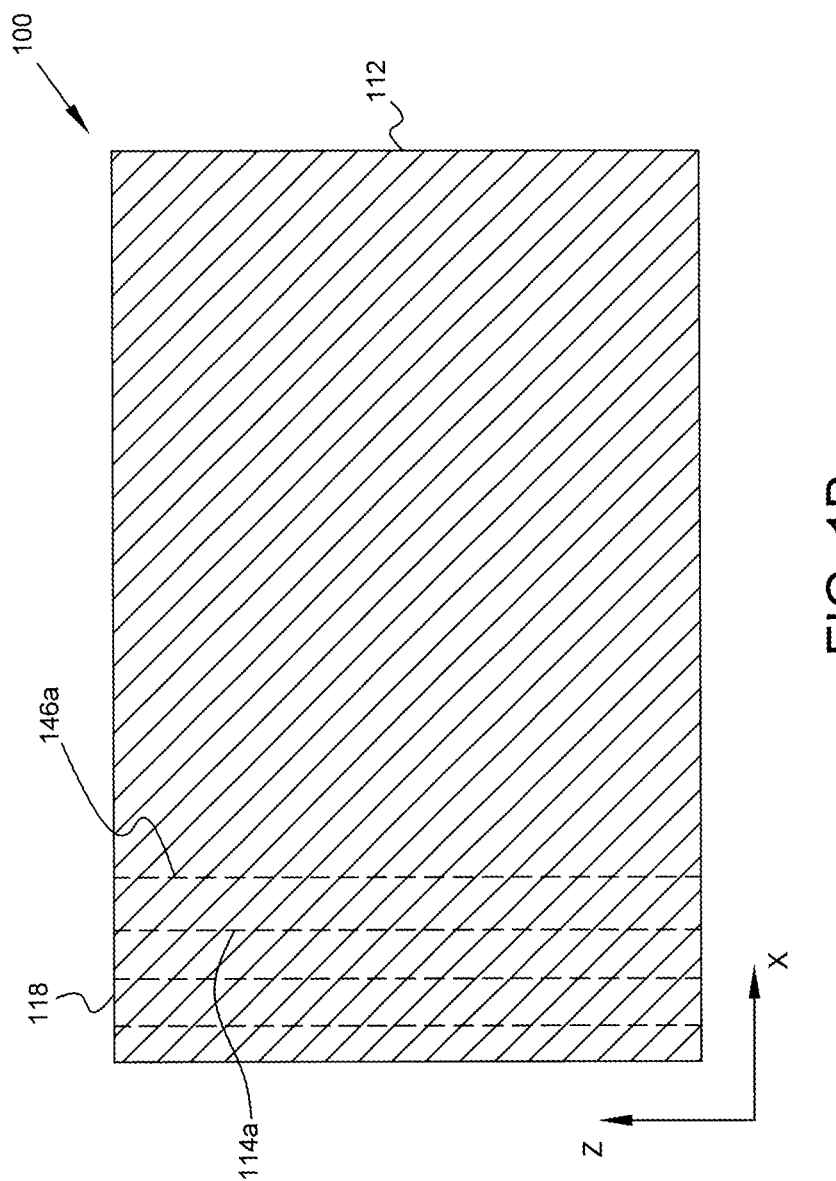
FIG. 1B is a plan view of several layers of an example of an interdigitated capacitor according to some embodiments.

As shown, each of the first and second pluralities of planar continuous electrode elements are rectangular plates. However, any suitable topology can be utilized for the electrode elements (e.g., square, parallelogram, etc.). As illustrated, each of the first and second pluralities of rectangular plate electrode elements are planar continuous as they extend continuously from a respective first edge of the respective rectangular plate to a respective second edge of the respective rectangular plate in the x and z orthogonal directions that are parallel to the plane of the capacitor structure. In the illustrated embodiment, neither of the first and second planar electrode structures 110, 140 include multiple, discrete electrode elements along the same plane. With reference to FIG. 1G, in some embodiments, the first and second electrode structures are formed above a semiconductor substrate 160 and the plane of the capacitor structure 100 is parallel to the plane of the substrate 160. The substrate 160 can be a bulk silicon substrate, a bulk silicon germanium (SiGe) substrate, a Group III-V compound substrate, a silicon-on-insulator (SOI) substrate, or a substrate formed of other suitable materials. The substrate 160 can be a display substrate such as a liquid crystal display (LCD), a plasma display, an electro luminescence (EL) lamp display, or a light emitting diode (LED) substrate, according to various embodiments. The substrate 160 can be doped with a p-type or an n-type impurity. In some embodiments, an insulating layer 170 can be formed above the semiconductor substrate 160 and below the first 110 and second 140 planar electrode structures.

In various embodiments, the first planar electrode structure 110 also includes a first conductor 118 interconnecting the first plurality of planar continuous rectangular plate electrode elements 112, 114a, 114b, 116a, 116b. As shown, first conductor 118 interconnects the first plurality of planar continuous rectangular plate electrode elements 112, 114a, 114b, 116a, 116b parallel to a y-axis that is normal to the x and z orthogonal directions. In various embodiments, the second planar electrode structure 140 includes a second conductor 148 interconnecting the second plurality of planar continuous rectangular plate electrode elements 142, 144a, 144b, 146a, 146b. In the illustrated embodiment, the second conductor 148 interconnects the second plurality of planar continuous rectangular plate electrode elements 142, 144a, 144b, 146a, 146b parallel to the y-axis that is normal to the x and z orthogonal directions. First 118 and second 148 conductors are formed from an aluminum, copper, or an alloy of aluminum or copper, material. In some embodiments, first 118 and second 148 conductors can include a material such as, for example, doped polysilicon, doped single-crystal silicon, titanium, molybdenum, tungsten, Al—Si, $TiSi_2$, TiN, $MoSi_2$, PtSi, $CoSi_2$, $WTiSi_2$, or other suitable material. In some embodiments, the first 118 and second 148 conductors each include at least one via. In various embodiments, the at least one via of the respective conductor (118, 148) electrically connects the respective plurality of planar continuous rectangular plate electrode elements 112, 114a, 114b, 116a, 116b (142, 144a, 144b, 146a, 146b) to each other at different interconnect levels.

In some embodiments, the first conductor 118 includes a first plurality of conductive vias connecting the respective plurality of planar continuous rectangular plate electrode elements 112, 114a, 114b, 116a, 116b of the first planar electrode structure 110 to each other and the second conductor 148 includes a second plurality of conductive vias connecting the respective plurality of planar continuous rectangular plate electrode elements 142, 144a, 144b, 146a, 146b of the second planar electrode structure 140 to each other. For example, FIG. 1D provides a plan view of several layers of an example of an interdigitated capacitor structure 100 according to some embodiments. As shown, a first plurality of conductive vias (118a-f) interconnects top planar continuous rectangular plate electrode element 112 to the other planar continuous rectangular plate electrode elements in the first plurality including electrode element 114a, and electrode elements 114b, 116a, 116b (FIG. 1A) parallel to the y-axis.

FIG. 1F, for example, shows a plan view of several layers of an example of an interdigitated capacitor structure 100, from which the sixth metal layer ("M6 layer") (including top electrode element 112) is omitted for ease of viewing several of the underlying layers according to embodiments of the present disclosure. In the illustrated embodiments, a first plurality of conductive vias (118a-f) are formed to interconnect top planar continuous rectangular plate electrode element 112 (FIG. 1A) to planar continuous rectangular plate electrode element 114a and the other planar continuous rectangular plate electrode elements in the first plurality 114b, 116a, 116b (FIG. 1A) parallel to the y-axis. As shown, a second plurality of conductive vias (148a-f) interconnects planar continuous rectangular plate electrode element 146a to the other planar continuous rectangular plate electrode elements in the second plurality 144a, 144b, 146b, 142 (FIG. 1A) parallel to the y-axis. In various embodiments, the first and second plurality of conductive vias include square vias (118a-f, 148a-f). In some embodiments, the first and second plurality of conductive vias include slot vias.

In various embodiments, the first and second plurality of conductive vias 118 comprise via lines extending parallel to an axis (e.g., z-axis) of each respective planar continuous rectangular plate electrode element 112, 114a, 114b, 116a, 116b (142, 144a, 144b, 146a, 146b). For example, FIG. 1B is a plan view of several layers of an example of an interdigitated capacitor structure 100 according to some embodiments. In the illustrated embodiment, via line 118 interconnects top planar continuous rectangular plate electrode element 112 to planar continuous rectangular plate electrode element 114a (FIG. 1A) and the other planar continuous rectangular plate electrode elements in the first plurality 114b, 116a, 116b (FIG. 1A) parallel to the y-axis. Referring now to FIG. 1E, a plan view of several layers of an example of an interdigitated capacitor, from which the M6 layer (including top electrode element 112) is omitted for ease of viewing several of the underlying layers according to embodiments of the present disclosure is provided. As shown, via line 118 is formed to interconnect top planar continuous rectangular plate electrode element 112 (FIG. 1A) to planar continuous rectangular plate electrode element 114a and the other planar continuous rectangular plate electrode elements in the first plurality 114b, 116a, 116b (FIG. 1A) parallel to the y-axis. Via line 148 is illustrated as interconnecting planar continuous rectangular plate electrode element 146a to the other planar continuous rectangular plate electrode elements in the second plurality 144a, 144b, 146b, 142 (FIG. 1A) parallel to the y-axis. Each of the illustrated via lines 118, 148 extend parallel to the z-axis of each respective planar continuous rectangular plate electrode element 114a, 146a (112, 114b, 116a, 116b (142, 144a, 144b, 146b) (FIG. 1A)).

In various embodiments, the first electrode structure 110 is electrically connected to a first terminal (not shown) of a first polarity and the second electrode structure 140 is electrically connected to a second terminal (not shown) of a second polarity. In various embodiments, the first and second polarities are opposite to each other. In some embodiments, the first electrode structure 110 is an anode and the second electrode structure 140 is a cathode. In other embodiments, the first electrode structure 110 is a cathode and the second electrode structure 140 is an anode.

Referring back to FIG. 1A, in various embodiments, the first 110 and second 140 planar electrode structures are arranged with respective planar continuous rectangular plate electrode elements 112, 114a, 114b, 116a, 116b (142, 144a, 144b, 146a, 146b) of each planar electrode structure 110, 140 interleaved and substantially parallel with each other between the first 118 and second 148 conductors. As shown in FIG. 1A, the planar interdigitated capacitor structure 100 includes bottom planar continuous rectangular plate electrode element 142 of the second electrode structure 140 and top planar continuous rectangular plate electrode element 112 of the first electrode structure 110. As shown in the illustrated embodiment, each of the planar continuous rectangular plate electrode elements 112, 114a, 114b, 116a, 116b (142, 144a, 144b, 146a, 146b) are substantially parallel to each other and are interleaved between the first 118 and second 148 conductors.

In various embodiments, the first plurality of planar continuous rectangular plate electrode elements 112, 114a, 114b, 116a, 116b of the first electrode structure 110 includes a top planar continuous rectangular plate electrode element 112 having a first continuous length measured parallel to the x-direction and a first continuous width measured parallel to the z-direction, a third plurality of planar continuous rectangular plate electrode elements 116a, 116b having respective continuous widths (measured parallel to the z-direction) substantially equal to the first continuous width and respective second continuous lengths (measured parallel to the x-direction) that are shorter than the first continuous length, and a fourth plurality of planar continuous rectangular plate electrode elements 114a, 114b having respective continuous widths (measured parallel to the z-direction) substantially equal to the first continuous width and respective third continuous lengths (measured parallel to the x-direction) that are shorter than the first and second continuous lengths. In embodiments, the second plurality of planar electrode elements 142, 144a, 144b, 146a, 146b of the second electrode structure 140 include a bottom planar continuous rectangular plate electrode element 142 having a respective continuous length (measured parallel to the x-direction) and a respective continuous width (measured parallel to the z-direction) that are substantially equal to the first length and the first width, a fifth plurality of continuous rectangular plate planar electrode elements having respective continuous widths (measured parallel to the z-direction) substantially equal to the first continuous width and respective continuous lengths (measured parallel to the x-direction) that are substantially equal to the second continuous lengths and a sixth plurality of planar continuous rectangular plate electrode elements having respective continuous widths (measured parallel to the z-direction) substantially equal to the first continuous width and respective continuous lengths (measured parallel to the x-direction) that are substantially equal to the third continuous lengths.

For example, in embodiments illustrated in FIG. 1A, a respective planar continuous rectangular plate electrode element of the fourth plurality 114a is formed between the top planar continuous rectangular plate electrode element 112 and one respective planar continuous rectangular plate electrode element of the third plurality 116a. A respective planar continuous rectangular plate electrode element of the sixth plurality 144b is formed between the bottom planar continuous rectangular plate electrode element 142 and one respective planar continuous rectangular plate electrode element of the fifth plurality 146b. Other respective planar continuous rectangular plate electrodes of the respective fourth 114b and sixth pluralities 144a are formed between other respective planar continuous rectangular plate electrodes of the third 116a, 116b and fifth 146b, 146a pluralities.

In various embodiments, the spacing between the respective plurality of planar continuous rectangular plate electrode elements in the respective planar electrode structure is the same. In some embodiments, the spacing between the respective plurality of planar continuous rectangular plate electrode elements in the respective planar electrode structure is not the same. In various embodiments, the spacing between respective substantially parallel and interleaved planar continuous rectangular plate electrode elements of the first and second electrode structures is the same. In various embodiments, the spacing between respective substantially parallel and interleaved planar continuous rectangular plate electrode elements of the first and second electrode structures is not the same. In some embodiments, each of the respective plurality of planar continuous rectangular plate electrode elements 112, 114a, 114b, 116a, 116b (142, 144a, 144b, 146a, 146b) of the respective planar electrode structure 110, 140 is different in length.

The interdigitated capacitor structure 100 also includes a dielectric material (not shown) between the first planar electrode structure 110 and the second planar electrode structure 140. The dielectric material can include silicon oxide, silicon nitride, silicon oxy-nitride, ELK material, aluminum-containing dielectrics, such as $Al_2O_3$, HfAlO, HfAlON, AlZrO, Hf-containing materials, such as $HfO_2$, $HfSiO_x$, $HfAlO_x$, $HfZrSiO_x$, HfSiON, other materials such as $LaAlO_3$ and $ZrO_2$ and/or any other suitable material. In various embodiments, the dielectric material is provided between the first plurality of planar continuous rectangular plate electrode elements 112, 114a, 114b, 116a, 116b and the second conductor 148 and between the second plurality of planar continuous rectangular plate electrode elements 142, 144a, 144b, 146a, 146b and the first conductor 118.

Figure 1C:
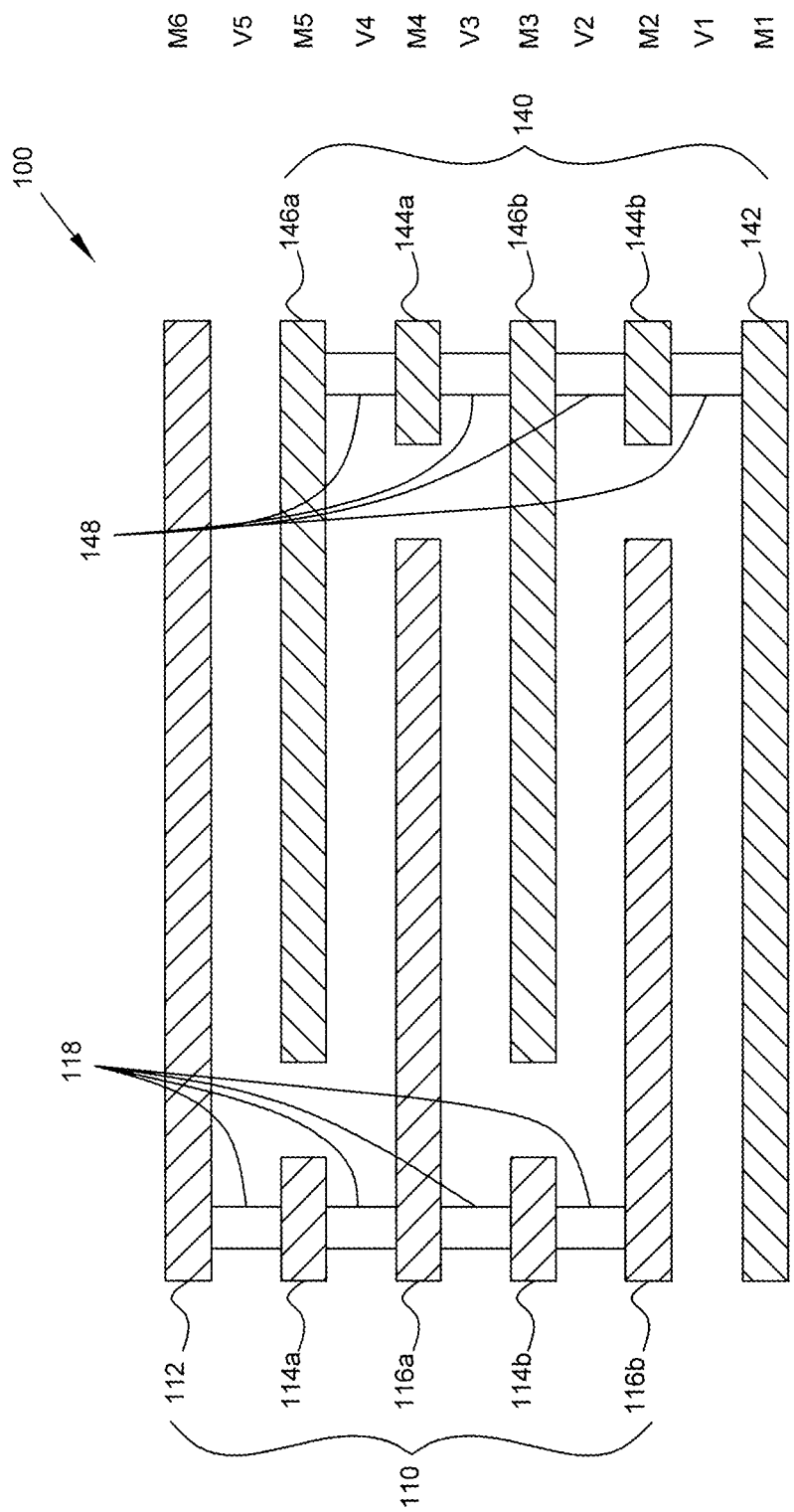
FIG. 1C is a cross-sectional view of an example of an interdigitated capacitor according to embodiments of the present disclosure.
Figure 1D:
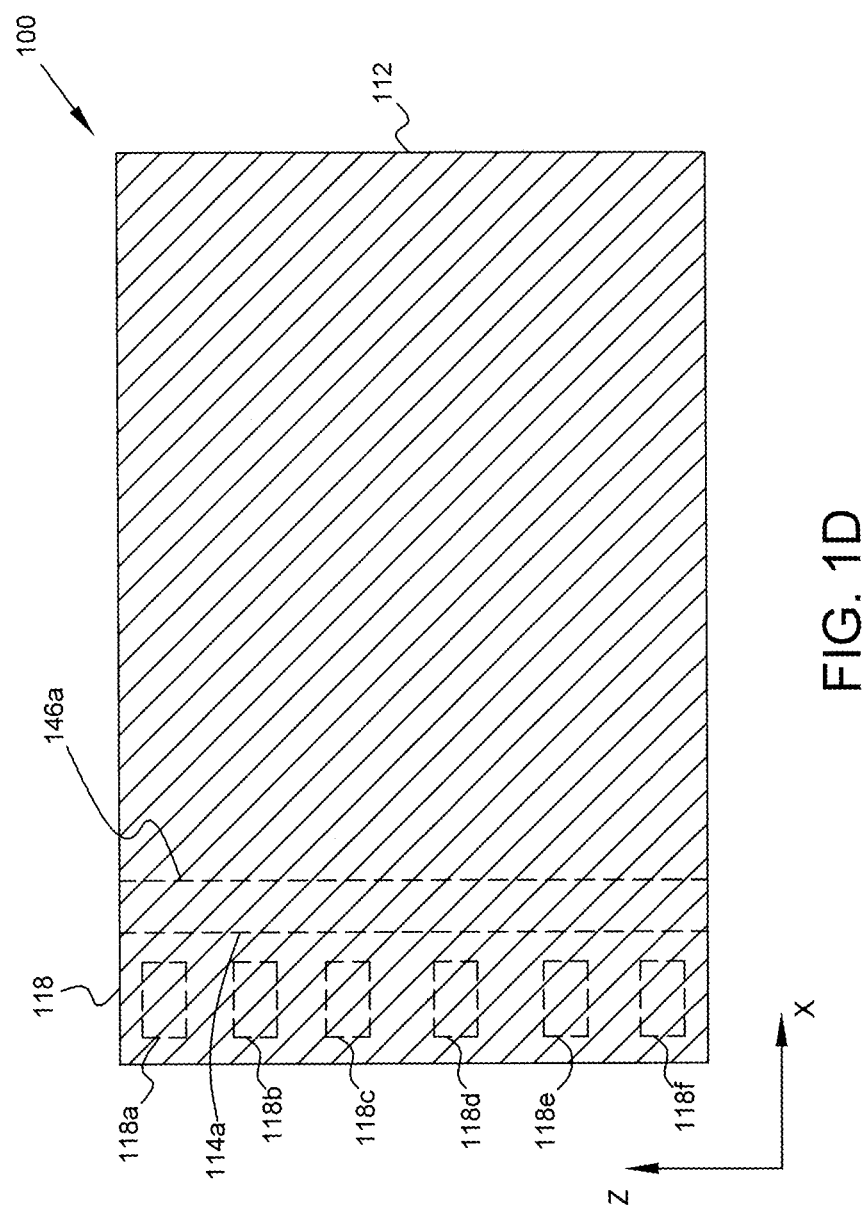
FIG. 1D is a plan view of several layers of an example of an interdigitated capacitor according to some embodiments.
Figure 1E:
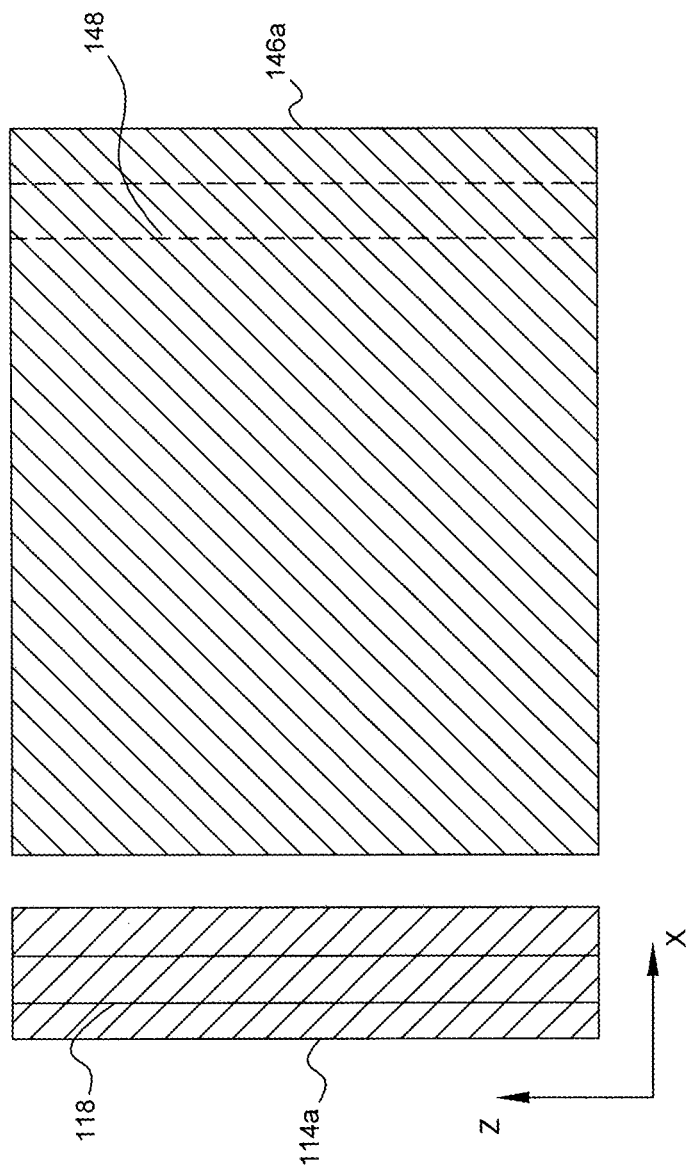
FIG. 1E is a plan view of several layers of an example of an interdigitated capacitor, from which the M6 layer is omitted for ease of viewing several of the underlying layers according to embodiments of the present disclosure.
Figure 1G:
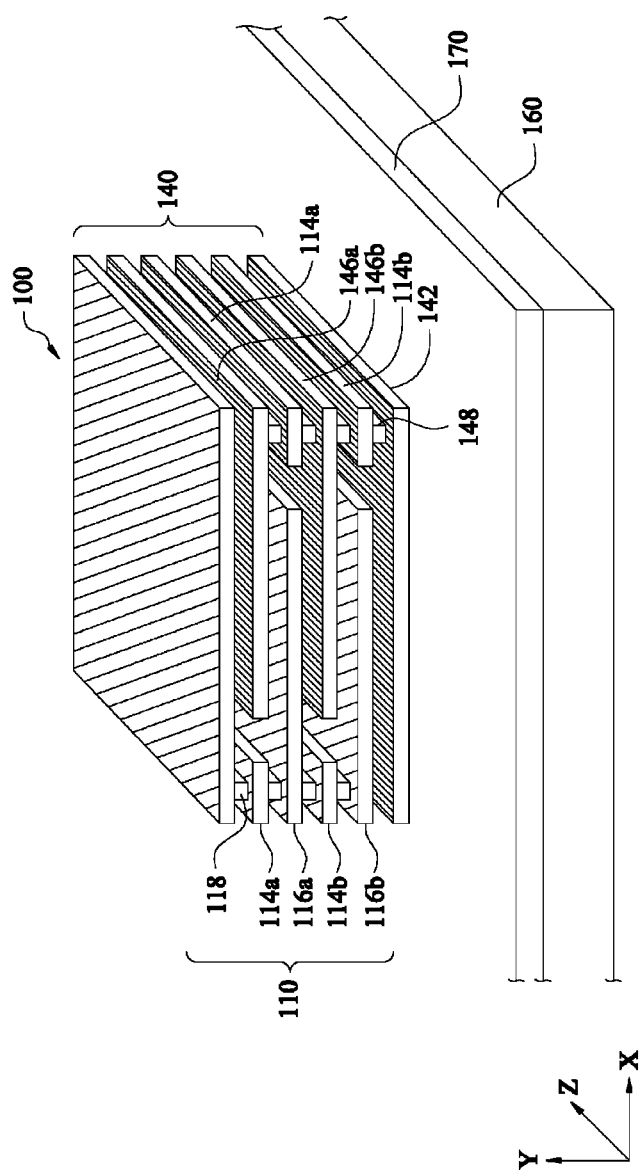
FIG. 1G is a schematic view of an example of a device including an interdigitated capacitor according to embodiments of the present disclosure.
Figure 2A:
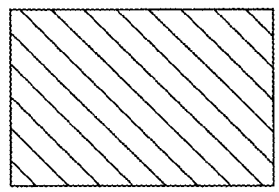
FIGS. 2A-2F illustrate plan views of metal layers for an example of an interdigitated capacitor according to some embodiments.
Figure 2B:
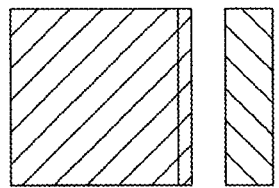
Figure 2C:
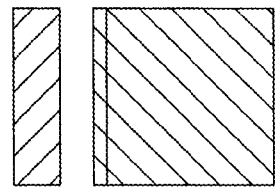
Figure 2D:
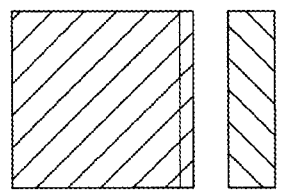
Figure 2E:
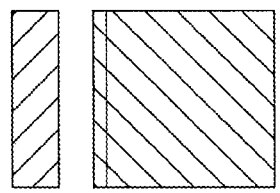
Figure 2F:
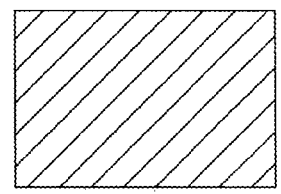
Figure 2G:
FIGS. 2G-2K illustrates plan views of via layers for an example of an interdigitated capacitor according to some embodiments.
Figure 2H:
Figure 2I:
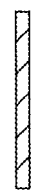
Figure 2J:
Figure 2K:

Referring now to FIG. 1C, a cross-sectional view of an example of an interdigitated capacitor structure 100 according to embodiments of the present disclosure is shown. In various embodiments, the interdigitated capacitor structure 100 is formed above a semiconductor substrate 160 (FIG. 1G) and the plane of the capacitor structure 100 is parallel to the plane of the substrate (x-z plane in FIG. 1G). In some embodiments, an insulating layer 170 (FIG. 1G) can be formed above the semiconductor substrate 160 (FIG. 1G) and below the interdigitated capacitor structure 100. As shown in the illustrated embodiment, and as described above for FIG. 1A, each of the planar continuous rectangular plate electrode elements 112, 114a, 114b, 116a, 116b (142, 144a, 144b, 146a, 146b) are substantially parallel to each other and are interleaved between the first 118 and second 148 conductors. First 118 and second 148 conductors are shown as interconnecting the respective plurality of planar continuous rectangular plate electrode elements in the respective planar electrode structure 110, 140. Various metal layers (M1-M6) and interconnect or via layers (V1-V6) of interdigitated capacitor structure 100 are shown in the illustrated embodiment of FIG. 1C.

In the illustrated embodiment, second electrode structure 140 includes bottom planar continuous rectangular plate electrode element 142 formed at a first metal layer ("M1"). Although the conductive electrode layers are commonly referred to as "metal" layers, the conductive electrodes can be formed of other conductive materials, such as polycrystalline silicon, as described above. As shown, the first electrode structure includes planar continuous rectangular plate electrode element 116b and the second electrode structure 140 includes planar continuous rectangular plate electrode element 144b formed at a second metal layer ("M2"). Conductor 148 is disposed in the first interconnect or via layer ("V1") and interconnects bottom planar continuous rectangular plate electrode element 142 and planar continuous rectangular plate electrode element. In the illustrated embodiment, the first electrode structure includes planar continuous rectangular plate electrode element 114b and the second electrode structure 140 includes planar continuous rectangular plate electrode element 146b formed at a third metal layer ("M3"). Conductors 148 and 118 are disposed in the second interconnect or via layer ("V2") and respectively interconnect planar continuous rectangular plate electrode elements 144b and 146b and planar continuous rectangular plate electrode elements 114b and 116b.

As shown, the first electrode structure 110 includes planar continuous rectangular plate electrode element 116a and the second electrode structure 140 includes planar continuous rectangular plate electrode element 144a formed at a fourth metal layer ("M4"). Conductors 148 and 118 are disposed in the third interconnect or via layer ("V3") and respectively interconnect planar continuous rectangular plate electrode elements 146b and 144a and planar continuous rectangular plate electrode elements 114b and 116a. In the fifth metal layer ("M5") illustrated in FIG. 1C, the first electrode structure includes planar continuous rectangular plate electrode element 114a and the second electrode structure 140 includes planar continuous rectangular plate electrode element 146a. Conductors 148 and 118 are disposed in the fourth interconnect or via layer ("V4") and respectively interconnect planar continuous rectangular plate electrode elements 144a and 146a and planar continuous rectangular plate electrode elements 116a and 114a. As shown, first electrode structure 110 includes top planar continuous rectangular plate electrode element 112 formed at a sixth metal layer ("M6"). Conductor 118 is disposed in the fifth interconnect or via layer ("V5") and interconnects top planar continuous rectangular plate electrode element 112 and planar continuous rectangular plate electrode element 114a. In various embodiments, a dielectric material is provided between the first 110 and second 140 planar electrode structures as described above for FIG. 1A.

For simplicity, only five (5) planar continuous rectangular plate electrode elements are shown for each planar electrode structure. However, each planar electrode structure can include more planar continuous rectangular plate electrode elements to achieve a higher capacitance density. For example, the first and second planar electrode structures described above can easily accommodate high metal layer capacitor structures (e.g., M15 layer or higher). The inventor has determined that the interdigitated capacitor structure described above increases the coupling area of the anode and cathode electrode elements, has an increased capacitance density, and a high quality factor as the planar continuous rectangular plate electrode elements have lower resistance values than conventional discrete "finger" electrodes.

Examples of planar interdigitated capacitors are illustrated in FIGS. 2 and 3. For example, FIGS. 2A-2F and 2G-2K illustrate respective plan views of metal layers and via layers for an example of an interdigitated capacitor according to some embodiments. In the illustrated examples shown in FIGS. 2G-2K, the first and second conductors include a first and second plurality of conductive vias including via lines extending parallel to the z-axis (as shown in FIG. 1A) of each respective planar continuous rectangular plate electrode element. FIGS. 3A-3F and 3G-3K illustrate respective plan views of metal layers and via layers for another example of an interdigitated capacitor according to embodiments of the present disclosure. As shown in FIGS. 3G-3K, in various embodiments, the first conductor includes a first plurality of conductive vias connecting the respective plurality of planar continuous rectangular plate electrode elements of the first planar electrode structure to each other and the second conductor includes a second plurality of conductive vias connecting the respective plurality of planar continuous rectangular plate electrode elements of the second planar electrode structure to each other. In various embodiments, a device is formed including a semiconductor substrate, first 110 and second 140 electrode structures formed above the substrate, and as described above in FIGS. 1A-3K, a dielectric material is provided between the first planar electrode structure 110 and the second planar electrode structure 140.

Figure 4:
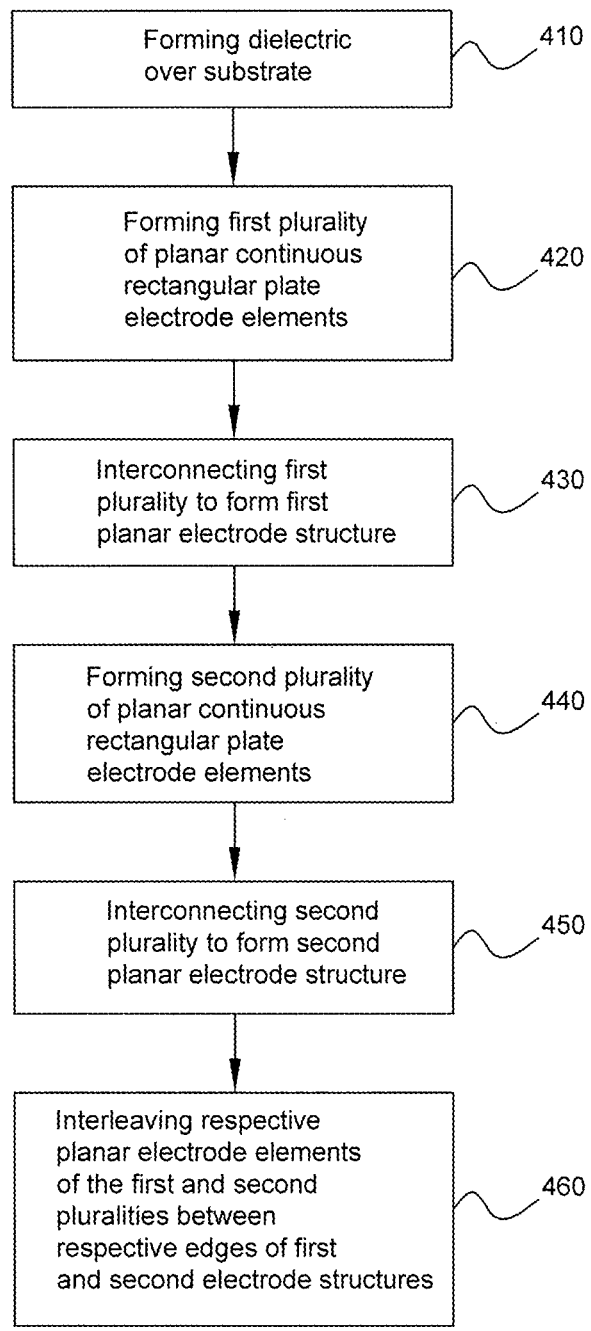
FIG. 4 is a flow chart illustrating a method of forming an interdigitated capacitor according to embodiments of the present disclosure.

With reference now to FIG. 4, a flow chart illustrating a method 400 of forming an interdigitated capacitor structure 100 according to embodiments of the present disclosure is provided. At block 410, a dielectric material is formed over a semiconductor substrate. The dielectric material can be formed over the substrate by an oxidation process, deposition process or any suitable process. At block 420, a first plurality of planar continuous rectangular plate electrode elements 142, 144a, 144b, 146a, 146b extending continuously in first and second orthogonal directions (e.g., x and z directions, FIG. 1A) substantially parallel to a plane of the substrate are formed. The first plurality of planar continuous rectangular plate electrode elements 142, 144a, 144b, 146a, 146b can be formed by a damascene process. In other embodiments, the first plurality of planar continuous rectangular plate electrode elements 142, 144a, 144b, 146a, 146b can be formed using a sputtering process, chemical vapor deposition process, or other process suitable for forming planar continuous electrode elements.

In various embodiments, the step of forming the first plurality of planar continuous rectangular plate electrode elements 420 also includes forming a bottom planar continuous rectangular plate electrode element 142 having a first continuous length and a first continuous width measured parallel to the first and second directions (e.g., x and z directions, FIG. 1A) respectively. The step of forming 420 can also include forming a third plurality of planar continuous rectangular plate electrode elements 146a, 146b having respective continuous widths (measured in the second direction (e.g., z direction, FIG. 1A)) substantially equal to the first continuous width and respective second continuous lengths (measured in the first direction (e.g., x direction, FIG. 1A)) that are shorter than the first continuous length. Forming the first plurality of planar continuous rectangular plate electrode elements 420 can also include forming a fourth plurality of planar continuous rectangular plate electrode elements 144a, 144b having respective continuous widths (measured in the second direction (e.g., z direction, FIG. 1A)) substantially equal to the first continuous width and respective third continuous lengths (measured in the first direction (e.g., x direction, FIG. 1A)) that are shorter than the first and second continuous lengths. In some embodiments, the step of forming the fourth plurality of planar continuous rectangular plate electrode elements 144a, 144b can include forming a respective planar continuous rectangular plate electrode element 144b (144a) of the fourth plurality between the bottom continuous rectangular plate planar electrode element 142 and one respective planar continuous rectangular plate electrode element of the third plurality 146b (146a). The step of forming the fourth plurality of planar continuous rectangular plate electrode elements 144a, 144b can also include forming another respective planar continuous rectangular plate electrodes 144a (144b) of the fourth plurality between two respective planar continuous rectangular plate electrodes of the third plurality 146a (146b).

At block 430, the first plurality of planar electrode elements 142, 144a, 144b, 146a, 146b are interconnected parallel to a third axis (e.g., y-axis, FIG. 1A) to form a first planar electrode structure 140. The first planar electrode structure 140 can be formed by a damascene process in which layers of inter-metal dielectric (IMD) material are deposited, trenches and vias are formed and filled with conductive material (e.g., copper), and the surface is planarized by chemical metal polishing (CMP). In other embodiments, the first planar electrode structure 140 can be formed using a sputtering process, chemical vapor deposition process, or other process suitable for forming an electrode structure. In various embodiments, the step of interconnecting 430 the first plurality of planar electrode elements 142, 144a, 144b, 146a, 146b includes forming a first conductor 148. In some embodiments, the first conductor 148 includes at least one via. In various embodiments, the step of interconnecting 430 includes forming a first plurality of conductive vias connecting the respective plurality of planar electrode elements 142, 144a, 144b, 146a, 146b to each other to form the first planar electrode structure 140.

At block 440, a second plurality of planar continuous rectangular plate electrode elements 112, 114a, 114b, 116a, 116b extending continuously in the first and second orthogonal directions (e.g., x and z directions, FIG. 1A) are formed. Similar to the first plurality of planar continuous rectangular plate electrode elements 142, 144a, 144b, 146a, 146b, the second plurality of planar continuous rectangular plate electrode elements 112, 114a, 114b, 116a, 116b can be formed by a damascene process, a sputtering process, chemical vapor deposition process, or other suitable process. In various embodiments, respective planar continuous rectangular plate electrode elements of the first and second pluralities can be formed in a single damascene process for a respective metal layer.

In various embodiments, the step of forming 440 the second plurality of planar continuous rectangular plate electrode elements 112, 114a, 114b, 116a, 116b includes the step of forming a fifth plurality of continuous rectangular plate planar electrode elements 116a, 116b having respective continuous widths (measured in the second direction (e.g., z direction, FIG. 1A)) substantially equal to the continuous width of the bottom planar continuous rectangular plate electrode element 142 and respective continuous lengths (measured in the first direction (e.g., x direction, FIG. 1A)) that are substantially equal to the respective continuous lengths of the third plurality of planar continuous rectangular plate electrode elements 146a, 146b. Forming the second plurality of planar continuous rectangular plate electrode elements 440 can also include the step of forming a sixth plurality of planar continuous rectangular plate electrode elements 114a, 114b having respective continuous widths (measured in the second direction (e.g., z direction, FIG. 1A)) substantially equal to the continuous width of the bottom planar continuous rectangular plate electrode element 142 and respective continuous lengths that are substantially equal to the respective continuous lengths of the fourth plurality of planar continuous rectangular plate electrode elements 144a, 144b. The step of forming 440 can also include the step of forming a top planar continuous rectangular plate electrode element 112 having a respective continuous length and a respective continuous width that are substantially equal to the respective continuous length and respective continuous width of the bottom planar continuous rectangular plate electrode element 142. In some embodiments, the step of forming the sixth plurality of planar continuous rectangular plate electrode elements 114a, 114b can include the step of forming a respective planar continuous rectangular plate electrode element of the sixth plurality 114a (114b) between the top planar continuous rectangular plate electrode 112 and one respective planar continuous rectangular plate electrode element of the fifth plurality 116a (116b). The step of forming the sixth plurality of planar continuous rectangular plate electrode elements 114a, 114b can also include the step of forming another respective planar continuous rectangular plate electrodes of the sixth plurality 114b (114a) between two respective planar continuous rectangular plate electrodes of the fifth plurality 116b, 116a.

At block 450, the step of interconnecting the second plurality of planar continuous rectangular plate electrode elements 112, 114a, 114b, 116a, 116b parallel to the third axis (e.g., y-axis, FIG. 1A) to form a second planar electrode structure 110 is shown. In various embodiments, the step of interconnecting 460 the second plurality of planar continuous rectangular plate electrode elements 112, 114a, 114b, 116a, 116b includes forming a second conductor 118. In some embodiments, the second conductor 118 includes at least one via. In various embodiments, the step of interconnecting 450 includes forming a second plurality of conductive vias connecting the respective plurality of planar electrode elements 112, 114a, 114b, 116a, 116b to each other to form the second planar electrode structure 110. In various embodiments, the first 140 and second 110 planar electrode structures are formed such that the dielectric material (now shown) is formed (block 410) between the first planar electrode structure 140 and the second planar electrode structure 110.

Referring now to block 460 of FIG. 4, the step of interleaving respective planar continuous rectangular plate electrode elements of the first 142, 144a, 144b, 146a, 146b and second 112, 114a, 114b, 116a, 116b pluralities between a respective edge parallel to the third axis (e.g., y-axis, FIG. 1A) of each planar electrode structure 140, 110 such that each of the first and second plurality of planar continuous rectangular plate electrode elements are substantially parallel with each other is shown. The first 140 and second 110 planar electrode structures are formed in an arrangement such that respective planar continuous rectangular plate electrode elements of each planar electrode structure alternate and are substantially parallel with each other between a respective edge parallel to the third axis (e.g., y-axis) of each planar electrode structure. In various embodiments, the step of interleaving 460 includes interleaving respective planar continuous rectangular plate electrode elements of the first and second pluralities such that the dielectric material is provided between the first planar electrode structure 140 and the second planar electrode structure 110.

Figure 3A:
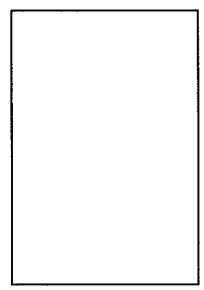
FIGS. 3A-3F illustrate plan views of metal layers for an example of an interdigitated capacitor according to embodiments of the present disclosure.
Figure 3B:
Figure 3C:
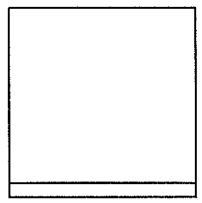
Figure 3D:
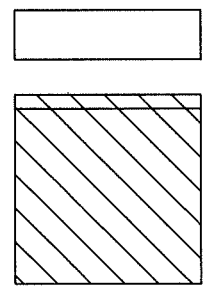
Figure 3E:
Figure 3F:
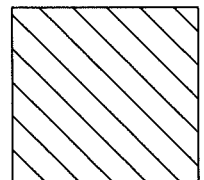

In various embodiments, the step of interleaving 460 includes forming a respective planar continuous electrode element of the third plurality 146b (146a) and a respective planar continuous electrode element of the sixth plurality 114b (114a) in a respective metal layer (e.g. M3 (M5), FIG. 3C) and between a respective edge parallel to the third axis (e.g. y-axis, FIG. 1A) of each planar electrode structure 140, 110. The step of interleaving 460 can also include forming a respective continuous electrode element of the fourth plurality 144b (144a) and a respective planar continuous electrode element of the fifth plurality 116b (116a) in a respective metal layer (e.g. M2 (M4), FIG. 3C) and between a respective edge parallel to the third axis (e.g. y-axis, FIG. 1A) of each planar electrode structure 140, 110. The step of interleaving 460 can also include forming a respective bottom planar continuous electrode element 142 of the first electrode structure in a first metal layer (e.g. MD and forming a respective top planar continuous electrode element 112 of the second electrode structure in a sixth metal layer (e.g. M6) and between a respective edge parallel to the third axis (e.g. y-axis, FIG. 1A) of each planar electrode structure 140, 110.

As shown by the various configurations and embodiments illustrated in FIGS. 1A-4, various improved interdigitated capacitor structures, devices incorporating the same, and methods for forming the same, have been described.

According to some embodiments, a device is provided. The device includes a semiconductor substrate and first and second planar electrode structures. The first planar electrode structure includes a first plurality of planar continuous rectangular plate electrode elements formed above the substrate and extending continuously in first and second orthogonal directions substantially parallel to a plane of the substrate and a first conductor interconnecting the first plurality of planar electrode elements parallel to a third axis substantially normal to the plane of the substrate. The second planar electrode structure includes a second plurality of planar continuous rectangular plate electrode elements formed above the substrate and extending continuously in the first and second orthogonal directions and a second conductor interconnecting the second plurality of planar electrode elements parallel to the third axis. The first and second planar electrode structures are arranged with respective continuous rectangular plate electrode elements of each planar electrode structure interleaved and substantially parallel with each other between the first and second conductors. The device also includes a dielectric material between the first planar electrode structure and the second planar electrode structure.

According to various embodiments, a planar interdigitated capacitor structure is provided. The planar interdigitated capacitor includes first and second planar electrode structures. The first planar electrode structure includes a first plurality of planar continuous rectangular plate electrode elements. Each of the first plurality of planar continuous rectangular plate electrode elements extends continuously from a respective first edge of the respective rectangular plate to a respective second edge of the respective rectangular plate in first and second orthogonal directions. The first planar electrode structure also includes a first conductor interconnecting the first plurality of planar continuous rectangular plate electrode elements parallel to a third axis substantially normal to the first and second directions. The second planar electrode structure includes a second plurality of planar continuous rectangular plate electrode elements. Each of the second plurality of planar continuous rectangular plate electrode elements extending continuously from a respective first edge of the respective rectangular plate to a respective second edge of the respective rectangular plate in the first and second orthogonal directions. The second planar electrode structure also includes a second conductor interconnecting the second plurality of planar continuous rectangular plate electrode elements parallel to the third axis. The first and second planar electrode structures are arranged with respective planar continuous rectangular plate electrode elements of each planar electrode structure interleaved and substantially parallel with each other between the first and second conductors. The planar interdigitated capacitor also includes a dielectric material between the first planar electrode structure and the second planar electrode structure.

According to some embodiments, a method of forming a planar interdigitated capacitor structure is provided. The method includes forming a dielectric material over a substrate. The method also includes forming a first plurality of planar continuous rectangular plate electrode elements extending continuously in first and second orthogonal directions substantially parallel to a plane of the substrate. The method further includes interconnecting the first plurality of planar electrode elements parallel to a third axis substantially normal to the plane of the substrate to form a first planar electrode structure. A second plurality of planar continuous rectangular plate electrode elements extending continuously in the first and second orthogonal directions are formed according to the method. The second plurality of planar continuous rectangular plate electrode elements are interconnected parallel to the third axis to form a second planar electrode structure. Respective planar continuous rectangular plate electrode elements of the first and second pluralities are interleaved between a respective edge parallel to the third axis of each respective planar electrode structure such that each of the first and second plurality of planar continuous rectangular plate electrode elements are substantially parallel with each other.

While various embodiments have been described, it is to be understood that the embodiments described are illustrative only and that the scope of the subject matter is to be accorded a full range of equivalents, many variations and modifications naturally occurring to those of skill in the art from a perusal hereof.

Furthermore, the above examples are illustrative only and are not intended to limit the scope of the disclosure as defined by the appended claims. Various modifications and variations can be made in the methods of the present subject matter without departing from the spirit and scope of the disclosure. Thus, it is intended that the claims cover the variations and modifications that can be made by those of ordinary skill in the art.

What I claim is:

1. A device, comprising:
   a semiconductor substrate extending in first and second orthogonal directions;
   a first electrode structure and a second electrode structure, each comprising:
     one or more first continuous rectangular plates having a respective first continuous length and a respective first continuous width measured parallel to the first and second directions respectively;
     one or more second continuous rectangular plates having a respective continuous width measured parallel to the first direction and substantially equal to the first continuous width and a respective continuous length measured parallel to the second direction and that is shorter than the first continuous length;
   a first conductor interconnecting the first and second continuous rectangular plates of the first electrode structure in a third direction normal to the first and second directions, and a second conductor interconnecting the first and second continuous rectangular plates of the second electrode structure in the third direction;
   wherein the first and second electrode structures are arranged with respective continuous rectangular plates thereof interleaved and substantially parallel with each other;
   wherein each first continuous rectangular plate of the first electrode structure is disposed at the same respective layer as a respective second continuous rectangular plate of the second electrode structure, and each second continuous rectangular plate of the first electrode structure is disposed at the same respective layer as a respective first continuous rectangular plate of the second electrode structure; and
   a dielectric material between the first electrode structure and the second electrode structure.

2. The device of claim 1, further comprising:
   an insulating layer formed above the semiconductor substrate and below the first and second electrode structures.

3. The device of claim 1, wherein the first conductor comprises a first plurality of conductive vias interconnecting the first and second continuous rectangular plates of the first electrode structure in the third direction and the second conductor comprises a second plurality of conductive vias interconnecting the first and second continuous rectangular plates of the second electrode structure in the third direction.

4. The device of claim 3, wherein the first and second plurality of conductive vias comprise respective via lines extending in the third direction.

5. The device of claim 4, wherein the respective via lines of the first and second plurality of conductive vias comprise square via lines.

6. The device of claim 1, wherein the first electrode structure further comprises a top continuous rectangular plate having a continuous width measured parallel to the first direction and substantially equal to the first continuous width and a continuous length measured parallel to the second direction and that is greater than the first continuous length; wherein the second electrode structure further comprises a bottom continuous rectangular plate having a continuous width measured parallel to the first direction and substantially equal to the first continuous width and a continuous length measured parallel to the second direction and substantially equal to the continuous length of the top continuous rectangular plate; wherein the first conductor interconnects the top, first and second continuous rectangular plates of the first electrode structure in the third direction, and wherein the second conductor interconnects the bottom, first and second continuous rectangular plates of the second electrode structure in the third direction.

7. The device of claim 6, wherein the top continuous rectangular plate is disposed at least one layer above each respective first and second continuous rectangular plate of the first and second electrode structures; and wherein the bottom continuous rectangular plate is disposed at least one layer below each respective first and second continuous rectangular plate of the first and second electrode structures.

8. A planar interdigitated capacitor structure, comprising:
   a first electrode structure and a second electrode structure, each comprising:
     one or more first continuous rectangular plates having a respective first continuous length and a respective first continuous width measured parallel to first and second orthogonal directions respectively; and
     one or more second continuous rectangular plates having a respective continuous width measured parallel to the first direction and substantially equal to the first continuous width and a respective continuous length measured parallel to the second direction and that is shorter than the first continuous length;
   a first conductor interconnecting the first and second continuous rectangular plates of the first electrode structure in a third direction normal to the first and second directions, and a second conductor interconnecting the first and second continuous rectangular plates of the second electrode structure in the third direction;
   wherein the first and second electrode structures are arranged with respective continuous rectangular plates thereof interleaved and substantially parallel with each other in the first, second and third directions;
   wherein each first continuous rectangular plate of the first electrode structure is disposed at the same respective layer as a respective second continuous rectangular plate of the second electrode structure, and each second continuous rectangular plate of the first electrode structure is disposed at the same respective layer as a respective first continuous rectangular plate of the second electrode structure; and
   a dielectric material between the first electrode structure and the second electrode structure.

9. The planar interdigitated capacitor structure of claim 8, wherein the first conductor comprises a first plurality of conductive vias interconnecting the first and second continuous rectangular plates of the first electrode structure in the third direction and the second conductor comprises a second plurality of conductive vias interconnecting the first and second continuous rectangular plates of the second electrode structure in the third direction.

10. The planar interdigitated capacitor structure of claim 9, wherein the first and second plurality of conductive vias comprise respective via lines extending in the third direction.

11. The planar interdigitated capacitor structure of claim 10, wherein the respective via lines of the first and second plurality of conductive vias comprise square via lines.

12. The planar interdigitated capacitor structure of claim 8, wherein the first electrode structure further comprises a top continuous rectangular plate having a continuous width measured parallel to the first direction and substantially equal to the first continuous width and a continuous length measured parallel to the second direction and that is greater than the first continuous length; wherein the second electrode structure further comprises a bottom continuous rectangular plate having a continuous width measured parallel to the first direction and substantially equal to the first continuous width and a continuous length measured parallel to the second direction and substantially equal to the continuous length of the top continuous rectangular plate; wherein the first conductor interconnects the top, first and second continuous rectangular plates of the first electrode structure in the third direction, and wherein the second conductor interconnects the bottom, first and second continuous rectangular plates of the second electrode structure in the third direction.

13. The planar interdigitated capacitor structure of claim 12, wherein the top continuous rectangular plate is disposed at least one layer above each respective first and second continuous rectangular plate of the first and second electrode structures; and wherein the bottom continuous rectangular plate is disposed at least one layer below each respective first and second continuous rectangular plate of the first and second electrode structures.

14. A device, comprising:
a first electrode structure and a second electrode structure, each comprising:
one or more first continuous plates having a respective first continuous length and a respective first continuous width measured parallel to first and second orthogonal directions respectively; and
one or more second continuous plates having a respective continuous width measured parallel to the first direction and substantially equal to the first continuous width and a respective continuous length measured parallel to the second direction and that is shorter than the first continuous length;
a first conductor interconnecting the first and second continuous plates of the first electrode structure in a third direction normal to the first and second directions, and a second conductor interconnecting the first and second continuous plates of the second electrode structure in the third direction;
wherein the first and second electrode structures are arranged with respective continuous plates thereof interleaved and substantially parallel with each other in the first, second and third directions;
wherein each first continuous plate of the first electrode structure is disposed at the same respective layer as a respective second continuous plate of the second electrode structure, and each second continuous plate of the first electrode structure is disposed at the same respective layer as a respective first continuous plate of the second electrode structure; and
a dielectric material between the first electrode structure and the second electrode structure.

15. The device of claim 14, wherein the first electrode structure further comprises a top continuous plate having a continuous width measured parallel to the first direction and substantially equal to the first continuous width and a continuous length measured parallel to the second direction and that is greater than the first continuous length; wherein the second electrode structure further comprises a bottom continuous plate having a continuous width measured parallel to the first direction and substantially equal to the first continuous width and a continuous length measured parallel to the second direction and substantially equal to the continuous length of the top continuous plate; wherein the first conductor interconnects the top, first and second continuous plates of the first electrode structure in the third direction, and wherein the second conductor interconnects the bottom, first and second continuous plates of the second electrode structure in the third direction.

16. The device of claim 15, wherein the top and bottom continuous plates have respective first and second opposing edges extending parallel to the first direction, wherein the respective first edges are disposed along the same axis parallel to the third direction, and wherein the respective second edges are disposed along the same axis parallel to the third direction.

17. The device of claim 14, further comprising:
a semiconductor substrate extending in the first and second directions; wherein the first and second electrode structures are disposed over the substrate.

18. The device of claim 6, wherein the top and bottom continuous rectangular plates have respective first and second opposing edges extending parallel to the first direction, wherein the respective first edges are disposed along the same axis parallel to the third direction, and wherein the respective second edges are disposed along the same axis parallel to the third direction.

19. The planar interdigitated capacitor structure of claim 12, wherein the top and bottom continuous rectangular plates have respective first and second opposing edges extending parallel to the first direction, wherein the respective first edges are disposed along the same axis parallel to the third direction, and wherein the respective second edges are disposed along the same axis parallel to the third direction.

20. The device of claim 14, wherein the respective first continuous plates and the respective second continuous plates of the first and second electrode structures are rectangular.

21. The device of claim 4, wherein the respective via lines of the first and second plurality of conductive vias comprise slot via lines.

22. The planar interdigitated capacitor structure of claim 10, wherein the respective via lines of the first and second plurality of conductive vias comprise square via lines.

* * * * *